(12) United States Patent
Soto et al.

(10) Patent No.: US 9,049,807 B2
(45) Date of Patent: Jun. 2, 2015

(54) PROCESSES OF MAKING PAD-LESS INTERCONNECT FOR ELECTRICAL CORELESS SUBSTRATE

(75) Inventors: Javier Soto, Chandler, AZ (US); Charan Gurumurthy, Gilbert, AZ (US); Robert Nickerson, Chandler, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1664 days.

(21) Appl. No.: 12/215,018

(22) Filed: Jun. 24, 2008

(65) Prior Publication Data

US 2009/0314519 A1 Dec. 24, 2009

(51) Int. Cl.
| | |
|---|---|
| *H05K 3/36* | (2006.01) |
| *H05K 3/40* | (2006.01) |
| *H01L 21/48* | (2006.01) |
| *H01L 23/498* | (2006.01) |
| *H05K 3/46* | (2006.01) |
| *H01L 23/31* | (2006.01) |
| *H05K 1/11* | (2006.01) |
| *H05K 3/00* | (2006.01) |
| *H05K 3/20* | (2006.01) |
| *H05K 3/24* | (2006.01) |
| *H05K 3/28* | (2006.01) |
| *H05K 3/34* | (2006.01) |

(52) U.S. Cl.
CPC .......... *H05K 3/4007* (2013.01); *H01L 21/4857* (2013.01); *H01L 21/486* (2013.01); *H01L 23/3128* (2013.01); *H01L 23/49827* (2013.01); H01L 2924/1433 (2013.01); H05K 1/113 (2013.01); H05K 3/0035 (2013.01); H05K 3/007 (2013.01); H05K 3/20 (2013.01); H05K 3/244 (2013.01); H05K 3/28 (2013.01); H05K 3/3457 (2013.01); *H05K 3/4682* (2013.01); H05K 2201/0367 (2013.01); H05K 2201/096 (2013.01); H05K 2203/0152 (2013.01); H05K 2203/1536 (2013.01); H01L 2224/16225 (2013.01)

(58) Field of Classification Search
CPC ..... H05K 3/4682; H05K 3/205; H05K 3/243; H05K 2203/0376; H01L 21/4857; H01L 21/6835; H01L 23/49822; H01L 2221/68345; H01L 2924/01087; H01L 2924/01044; H01L 2924/01046; H01L 2924/01078; H01L 2924/01079; H01L 2924/14; H01L 2924/15311; H01L 24/16; H01L 2224/16
USPC ........... 29/830–832, 842, 843, 846, 848, 849, 29/852; 174/255; 257/698, 723; 438/613, 438/618, 849, 852

See application file for complete search history.

(56) References Cited

U.S. PATENT DOCUMENTS

| | | | | |
|---|---|---|---|---|
| 4,306,925 A | * | 12/1981 | Lebow et al. | 29/848 |
| 6,379,159 B1 | * | 4/2002 | Mune et al. | 29/852 |
| 6,662,442 B1 | * | 12/2003 | Matsui et al. | 29/852 |
| 7,093,356 B2 | * | 8/2006 | Imafuji et al. | 29/847 |
| 7,222,421 B2 | * | 5/2007 | Nakamura | 29/846 |

* cited by examiner

*Primary Examiner* — Donghai D Nguyen
(74) *Attorney, Agent, or Firm* — Winkle, PLLC

(57) ABSTRACT

A microelectronic device includes a laminated mounting substrate including a die side and a land side with a surface finish layer disposed in a recess on the mounting substrate die side. An electrically conductive first plug is in contact with the surface finish layer and an electrically conductive subsequent plug is disposed on the mounting substrate land side and it is electrically coupled to the electrically conductive first plug and disposed directly below the electrically conductive first plug.

19 Claims, 7 Drawing Sheets

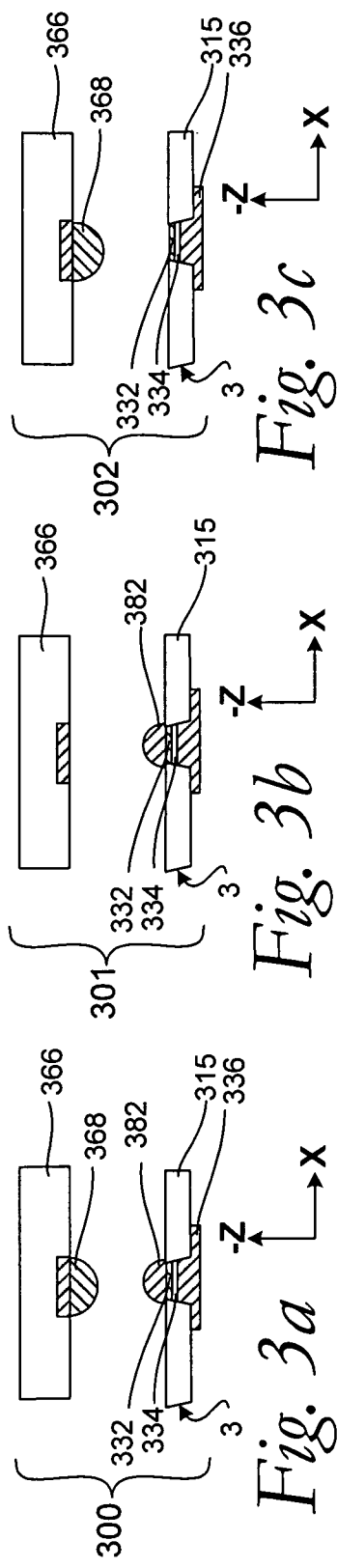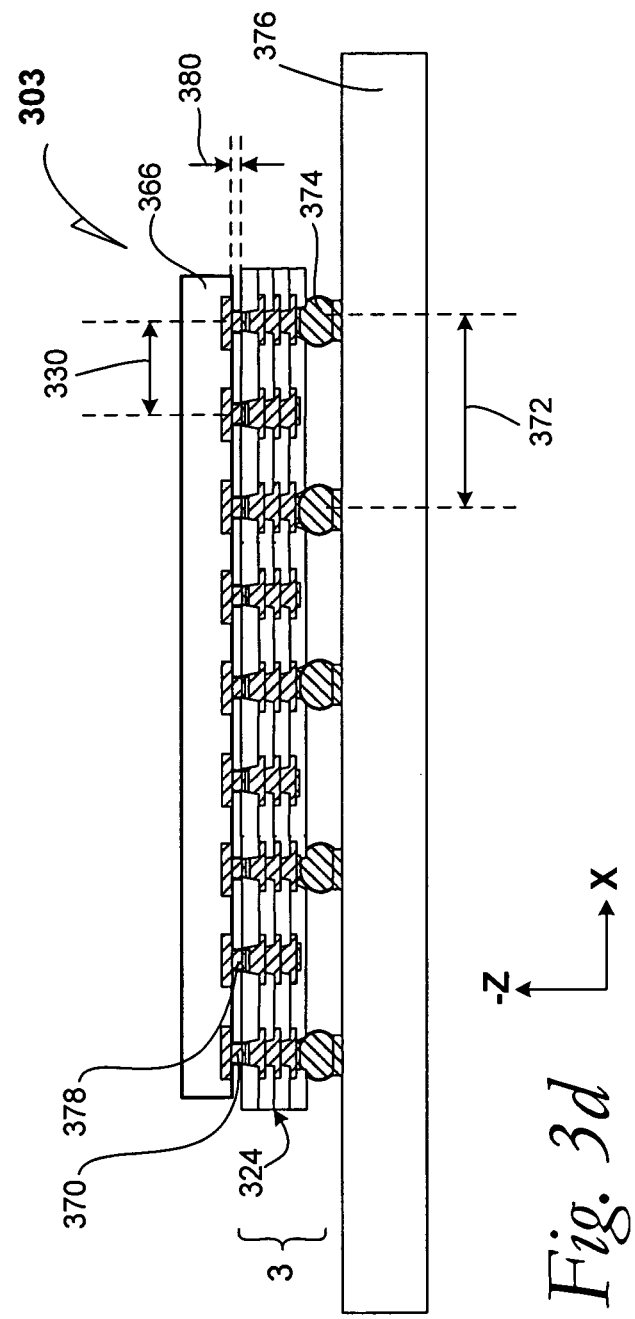

US 9,049,807 B2

PROCESSES OF MAKING PAD-LESS INTERCONNECT FOR ELECTRICAL CORELESS SUBSTRATE

TECHNICAL FIELD

Disclosed embodiments relate to semiconductive apparatus, packages, and processes of making them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 3a is a detail section of the microelectronic device apparatus indicating package to die interconnect where both die and package are bumped depicted in FIG. 3d during processing according to an example embodiment;

FIG. 3b is a detail section of the microelectronic device apparatus indicating package to die interconnect where only package is bumped depicted in FIG. 3d during processing according to an example embodiment;

FIG. 3c is a detail section of the microelectronic device apparatus indicating package to die interconnect where only die is bumped depicted in FIG. 3d during processing according to an example embodiment FIG. 3d is a cross section elevation of a microelectronic device apparatus indicating mother board, package and die whole set according to an example embodiment;

DETAILED DESCRIPTION

Reference will now be made to the drawings wherein like structures may be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the claimed structures of the illustrated embodiments. Moreover, the drawings show only the structures necessary to understand the illustrated embodiments. Additional structures known in the art have not been included to maintain the clarity of the drawings.

Figure 1A:
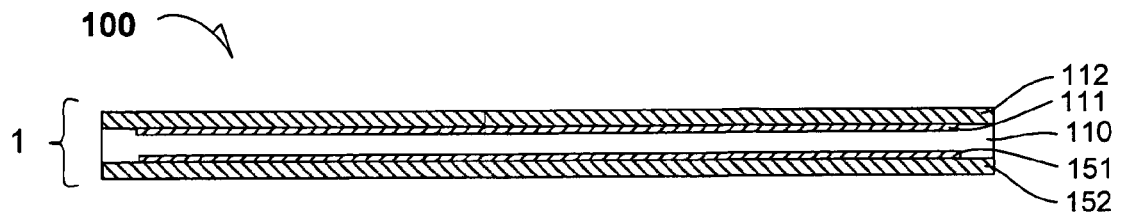
FIG. 1a is a cross-section elevation of a microelectronic device mounting substrate during core formation processing according to an embodiment.

FIG. 1a is a cross-section elevation of a microelectronic device mounting substrate 100 during processing according to an embodiment. Two separate metallic foils, for example copper, are laminated on each side of a central core 110 External metallic substrate layers 112, 152 are longer than center metallic substrate layers 111 and 151. A mounting substrate foundation 1 is a compose laminate of four metallic substrate layers and the central core 110 In an embodiment, the metallic substrates are made of copper foil. The central core 110, the first side metallic substrate layers 112 and 111, and the second side metallic substrate layers 152 and 151 are part of a mounting substrate foundation 1.

Figure 1B:
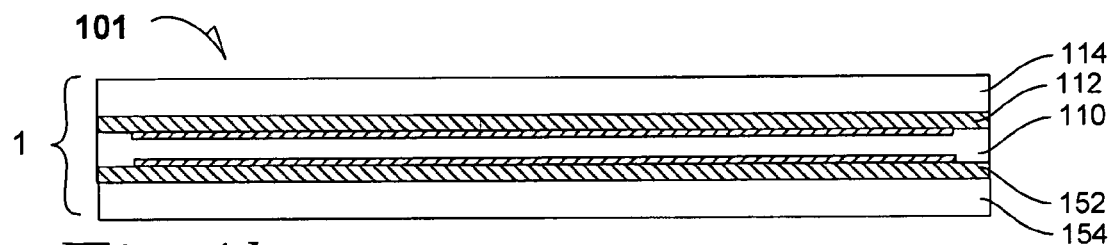
FIG. 1b is a cross-section elevation of the microelectronic device mounting substrate depicted in FIG. 1a after further first dielectric lamination processing according to an embodiment.

FIG. 1b is a cross-section elevation of the microelectronic device mounting substrate depicted in FIG. 1a after further processing according to an embodiment. The mounting substrate 101 has been processed to include a first dielectric layer 114. The first dielectric layer 114 may be referred to as a first side first dielectric layer 114 and the second side metallic substrate 152 also supports a second side first dielectric layer 154. Accordingly, the structure depicted in FIG. 1b may be referred to as part of the mounting substrate foundation 1.

Figure 2:
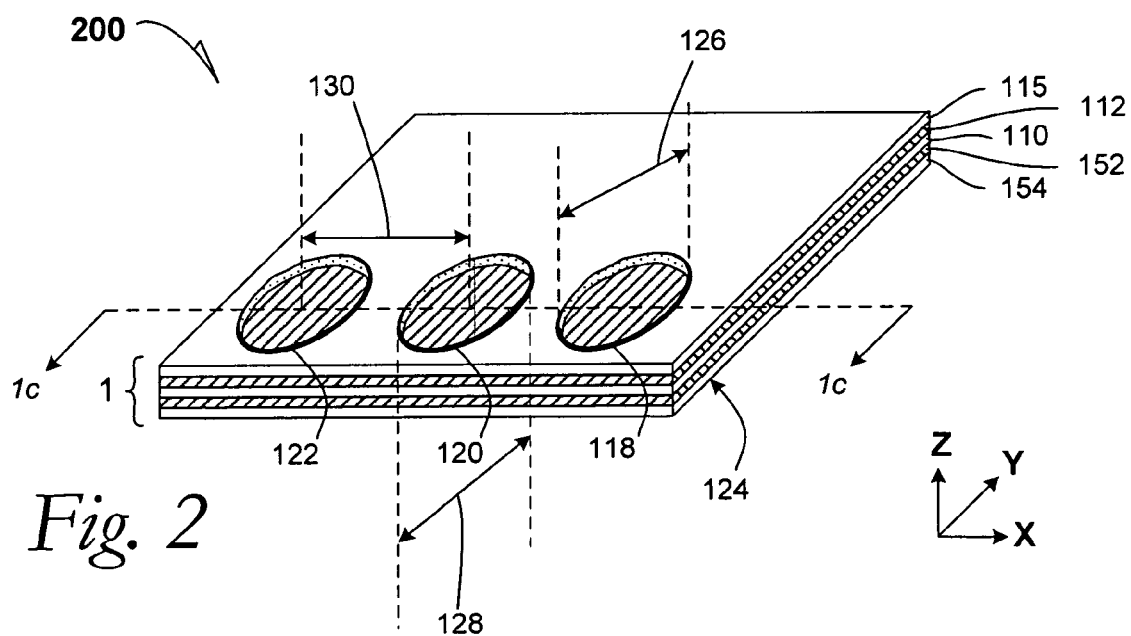
FIG. 2 is a perspective view of the microelectronic device mounting substrate depicted in FIG. 1b after lamination layer drilled and ready for external surface finish to be applied according to an embodiment.

FIG. 2 is a perspective view of the microelectronic device mounting substrate depicted in FIG. 1b after further processing according to an embodiment. The microelectronic device mounting substrate 200 includes the central core 110 and the four copper layers of the metallic substrates 112 and 111, and 152 and 151, and the first dielectric layers 114 and 154.

A recess 118 has been formed in the mounting substrate foundation 1 at the first dielectric layer 114 (FIG. 1b). The first dielectric layer 114 is henceforth designated as the first dielectric layer 115 with the recess 118 having changed the structure thereof. In an embodiment, the recess 118 is formed by radiant energy ablation of the first dielectric layer 115 such as a laser drilling process. In an embodiment, the recess 118 has formed a characteristic recess dimension such as a diameter that is later used as a final location for an electrical contact such as a micro ball or a micro solder bump in the 50

μm to 100 μm range. Spacing between recesses and recess diameter is controlled by the radiant energy ablation, where only the tolerance of radiant energy ablation is affecting the spacing and the recess diameter.

Three occurrences of the recess are depicted including the recess 118, the recess 120, and the recess 122. In an embodiment, the microelectronic device mounting substrate 200 includes an edge 124. The recess 118 is depicted being nearest the edge 124 such as a recess at the perimeter of a mounting substrate. The recesses 120 and 122 may be "center" recesses meaning they are nearer to the center of a mounting substrate than a nearby perimeter recess such as the recess 118. In an embodiment, the perimeter recess 118 has a first diameter 126 and the center recess 120 has a second diameter 128 that is smaller than the first diameter 126. In an embodiment, the first diameter 126 and the second diameter 128 have substantially the same diameter.

In an embodiment, the first diameter 126 is in a range from about 50 micrometer (μm) to about 100 μm. In an embodiment, the first diameter 126 is 74 μm and the second diameter 128 is smaller than the first diameter. In an embodiment, the first diameter 126 is 74 μm and the second diameter 128 is also 74 μm.

In an embodiment the center recess 120 and the center recess 122 are spaced apart on a center-to-center pitch 130 in a range from about 100 μm to about 180 μm. In an embodiment, the center-to-center pitch 130 is in a range from about 120 μm to about 150 μm. The pitch 130 is understood to be between a given recess and an adjacent recess. The pitch 130 between the perimeter recess 118 and the center recess 120 may be identical in each embodiment to the pitch 130 between the center recess 120 and the center recess 122. In an embodiment, the pitch 130 is about 150 μm. In an embodiment, the first diameter 126 is 74 μm and the pitch 130 is 150 μm. In an embodiment, the first diameter 126 is 74 μm, the second diameter 128 is smaller than the first diameter 126, and the pitch 130 is 150 μm. In an embodiment, the first diameter 126 is 74 μm, the second diameter 128 is also 74 μm, and the pitch 130 is 150 μm.

Formation of the several recesses 118, 120, and 122 is useful for a first and only registration for achieving an electrical connector landing space under design rules such as for a microball or a micro solder bump.

Figure 1C:
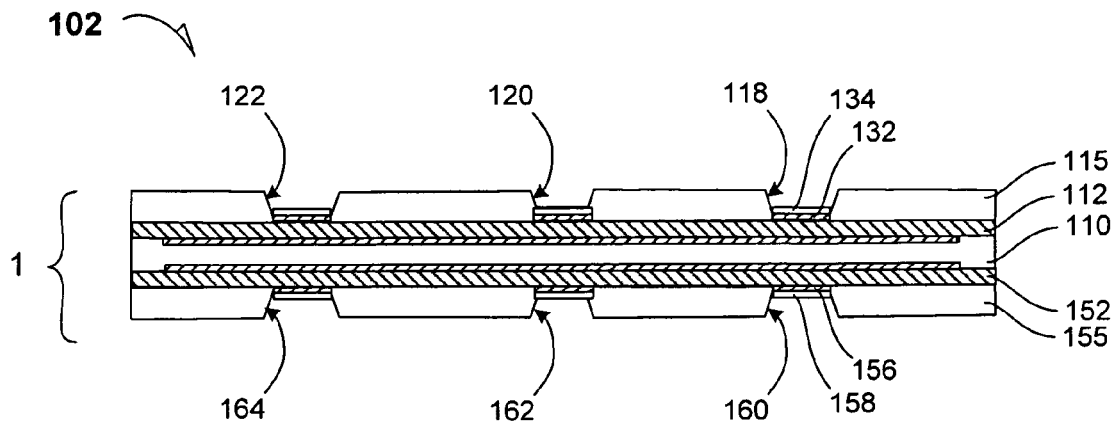
FIG. 1c is a cross-section elevation of the microelectronic device mounting substrate depicted in FIG. 1b after lamination layer drilled and external surface finish plated according to an embodiment.

FIG. 1*c* is a cross-section elevation of the microelectronic device mounting substrate depicted in FIG. 1*b* after further processing according to an embodiment. The mounting substrate 102 exhibits processing on the second side as well as the first side. On the first side, the recesses 118, 120 and 122 are shown. Similarly on the second side, recesses 160, 162 and 164 have been formed in the second side first dielectric layer 154 (FIG. 1*b*) and has been structurally altered by formation of the recesses 160, 162 and 164 to be referred to hereinafter as the second side first dielectric layer 115.

In an embodiment, the recess 118 has been processed by forming a surface finish first layer 132 upon the exposed first side metallic substrate 112. Similarly, the recess 160 has been processed by forming a second side surface finish first film 156 upon the exposed second side metallic substrate 152 according to an embodiment. In an embodiment, the surface finish first layer 132 is further processed by forming a surface finish second layer 134. In an embodiment, the surface finish first layer 132 is a material such as a gold metal (Au) and the surface finish second film 134 is a material such as a palladium-group alloy such as Au Pd Ni. The second side is processed similarly to form a surface finish first layer 156 of Au and the surface finish second layer 158 is a PdNiCu alloy.

Formation of the surface finish layers is self-aligned such that under design rules no further registration alignment is needed to form the recesses and the surface finish layers. Conventionally, more than a first and only registration alignment is needed. In an embodiment, the surface finish layers are achieved by electroplating a selected metal or alloy onto the metallic substrates 112 and 152. In an embodiment, the surface finish films are achieved by electrolytic plating where plating has an affinity only to the metal of the metallic substrates 112 and 152 and not to the dielectric layers 115 and 154.

Further processing may be understood to be carried out on the second side as well as the first side, but hereinafter, processing will be described only for the first side.

Figure 1D:
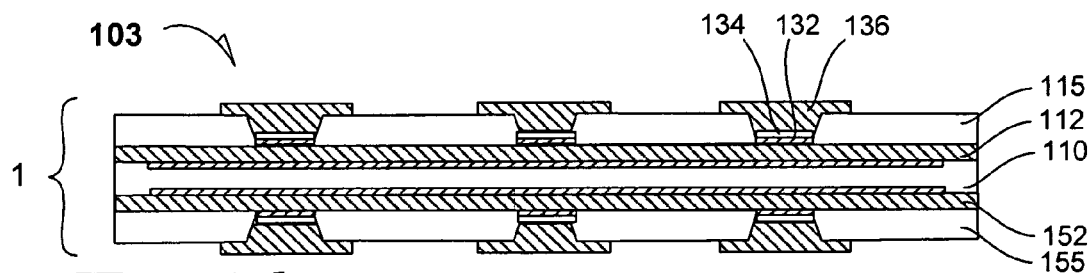
FIG. 1d is a cross-section elevation of the microelectronic device mounting substrate depicted in FIG. 1c after further via drilling and Cu plating processing according to an embodiment.

FIG. 1*d* is a cross-section elevation of the microelectronic device mounting substrate depicted in FIG. 1*c* after further processing according to an embodiment. The mounting substrate 103 has been photolithographically processed and plated to form an electrically conductive first plug 136 in contact with the surface finish second film 134. In an embodiment, the electrically conductive first plug 136 is a metal. In an embodiment, the electrically conductive first plug 136 is a copper metal, the surface finish second layer 134 that contacts the first plug 136 is a palladium-group metal or alloy, and the surface finish first film 132 is gold. In an embodiment, the electrically conductive first plug 136 is a metal such as copper, the surface finish second film 134 is an electrochemically more noble metal or alloy than the first plug 136, and the surface finish first layer 132 is a more noble metal or alloy than the second film 134.

Figure 1E:
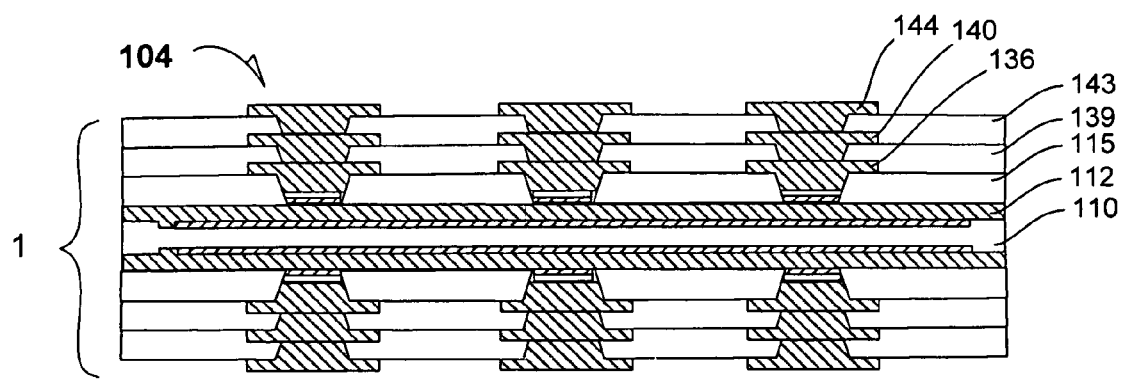
FIG. 1e is a cross-section elevation of the microelectronic device mounting substrate depicted in FIG. 1d after further lamination and metal routing definition according to an embodiment.

FIG. 1*e* is a cross-section elevation of the microelectronic device mounting substrate depicted in FIG. 1*d* after further processing according to an embodiment. The mounting substrate 104 has been processed to form several dielectric layers and conductive plugs. As illustrated, the electrically conductive first plug 136 has been formed through a recess in the first dielectric layer 115. Similarly, an electrically conductive second plug 140 has been formed through a recess in a second dielectric layer 130. Further, an electrically conductive subsequent plug 144 has been formed through a recess in a third dielectric layer 139. Further layers have been fabricated as illustrated on the second side. The electrically conductive subsequent plug 144 is a third plug as depicted in the illustrated embodiment. In an embodiment, the electrically conductive subsequent plug 144 may be a second plug, a third plug, or an $N^{th}$ plug where N is a number adapted to a specific application. In an embodiment, the mounting substrate foundation 1 may have several layers such as where N is equal to a number between 2 and 50. In an embodiment, N is between 4 and 10. In an embodiment, N is between 11 and 40. In an embodiment, the electrically conductive subsequent plug may be landing on a metallic and re-routed to another plug to be electrically connected to the next layer.

Figure 1F:
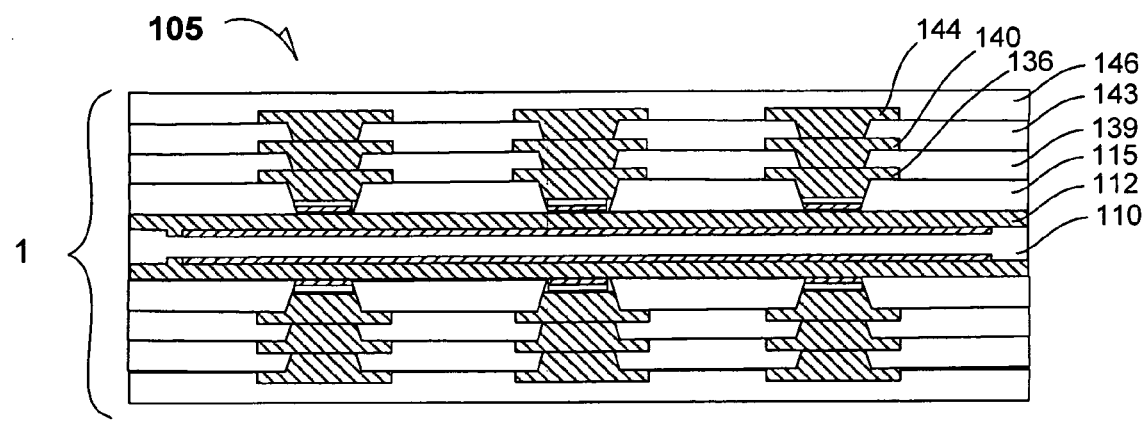
FIG. 1f is a cross-section elevation of the microelectronic device mounting substrate depicted in FIG. 1e after final build up process and external passivation layer processing according to an embodiment.

FIG. 1*f* is a cross-section elevation of the microelectronic device mounting substrate depicted in FIG. 1*e* after further processing according to an embodiment. The mounting substrate 105 has been overlaid with a solder mask layer 146 in preparation to forming a solder-resist open (SRO) to expose the electrically conductive subsequent plug 144.

Figure 1G:
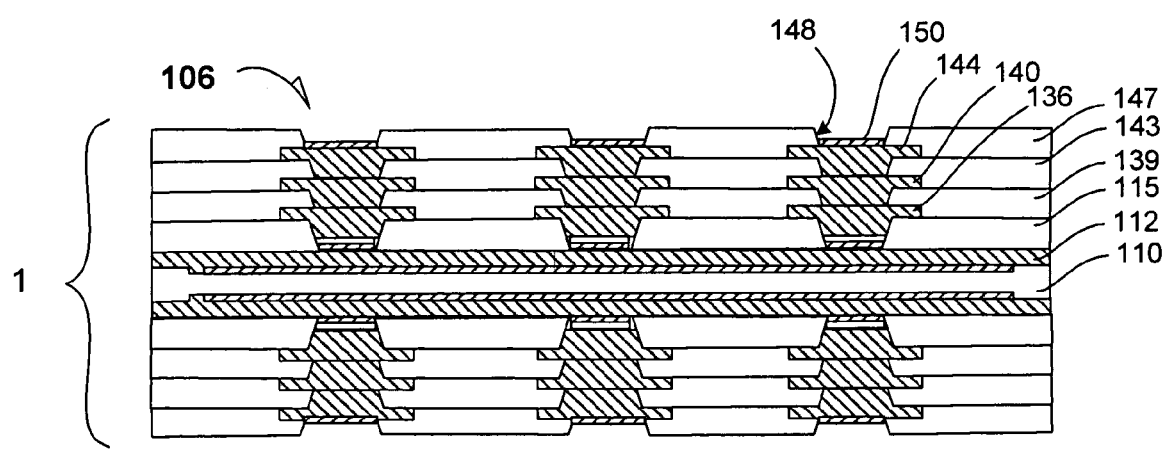
FIG. 1g is a cross-section elevation of the microelectronic device mounting substrate depicted in FIG. 1f after lithography pattern formation exposing metallic pads and covered by external surface finish further processing according to an embodiment.

FIG. 1*g* is a cross-section elevation of the microelectronic device mounting substrate depicted in FIG. 1*f* after further processing according to an embodiment. The mounting substrate 106 has been etched to form a land-side SRO 148 in the solder mask layer 147 (solder mask layer 146 in FIG. 1*f*). Further processing includes the formation of a land-side bond pad 150 in the land-side SRO 148.

Figure 1H:
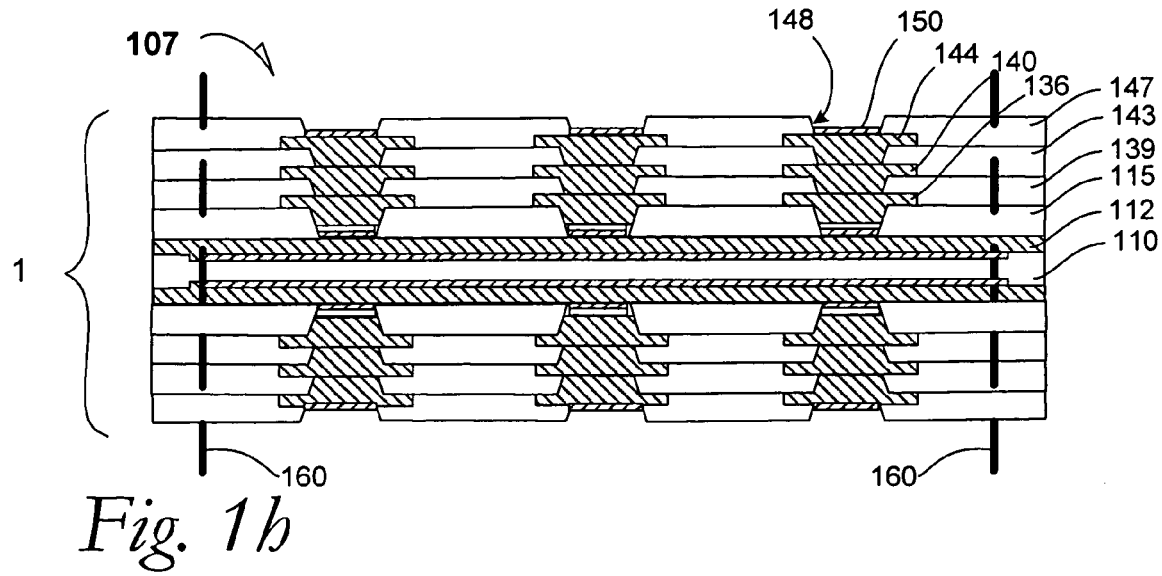
FIG. 1h is a cross-section elevation of the microelectronic device mounting substrate depicted in FIG. 1g indicating core cut for separation processing according to an embodiment.

FIG. 1h is a cross-section elevation of the microelectronic device mounting substrate depicted in FIG. 1g after further processing according to an embodiment. The mounting substrate 107 is in the process of being laterally cropped as indicated by the dashed cropping lines 160. The process of laterally cropping allows for the first side and the second side to be separated from the central core 110 to be discarded. In an embodiment during fabrication of the mounting substrate foundation 1, the first side and the second side act to counter warping and bowing forces that may be present without the first side countering the second side.

Figure 1J:
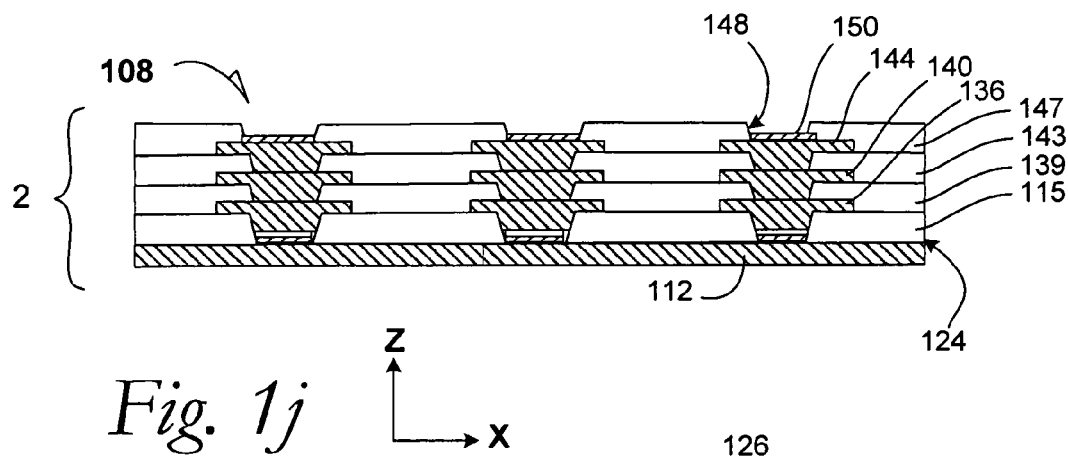
FIG. 1j is a cross-section elevation of the microelectronic device mounting substrate depicted in FIG. 1h after further separation, indicating only one side of the build up according to an embodiment.

FIG. 1j is a cross-section elevation of the microelectronic device mounting substrate depicted in FIG. 1h after further processing according to an embodiment. After cropping (FIG. 1h), the mounting substrate 108 exhibits the edge 124 as it appears is a finished mounting substrate. The mounting substrate foundation 2 is a cropped laminate and therefore has a different structure from the mounting substrate foundation 1 depicted in the previous FIGs. The mounting substrate 108 is also illustrated with an X-Z plane for further description.

Figure 1K:
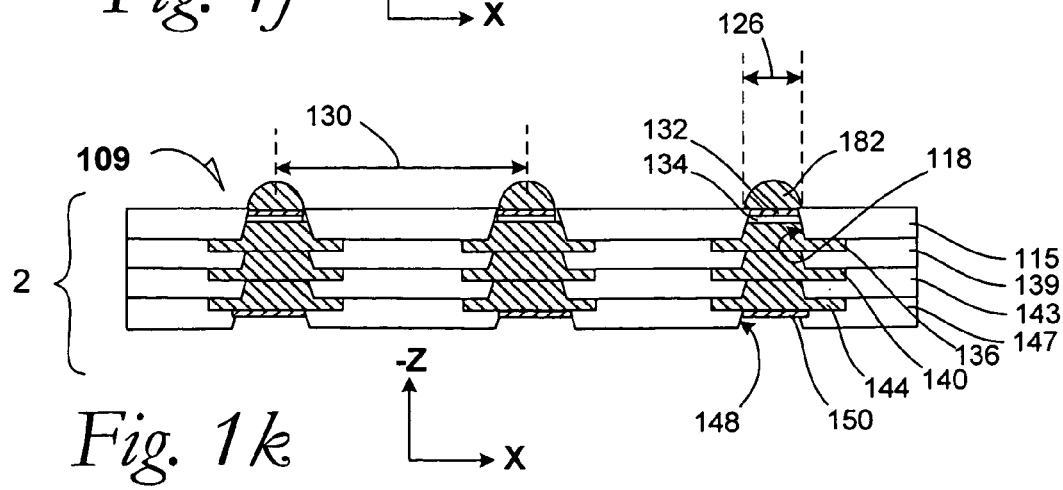
FIG. 1k is a cross-section elevation of the microelectronic device mounting substrate depicted in FIG. 1j after solder interconnect processing according to an embodiment.

FIG. 1k is a cross-section elevation of the microelectronic device mounting substrate depicted in FIG. 1j after further processing according to an embodiment. The mounting substrate 109 has been inverted compared to the presentation in FIG. 1j. The second side is not illustrated as it is virtually identical to the first side after removal of the central core 110. The metallic substrate 112 is also removed to expose the surface finish first film 132. In an embodiment, the metallic substrate 112 is copper and it is removed by a copper etchback process such as a chemical-mechanical polishing (CMP) technique.

In this configuration, the laminated mounting substrate 109 includes the surface finish films 132 and 134 disposed in the first recess 118 and the electrically conductive first plug 136 in direct contact with the surface finish first layer 132. Further, the electrically conductive subsequent plug 144 is disposed directly below the electrically conductive first plug 136.

After removal of the metallic substrate 112, an electrical contact 182 has been formed on the surface finish first layer 132. In an embodiment, the electrical contact 182 is a solder interconnect 182. In an embodiment, the electrical contact 182 is a micro solder bump 182 that has been placed by use of a solder paste template. In any event the first and only registration of each of the recesses such as the recess 118 has allowed for a self-aligned recess that accepts an electrical contact 182 above a metal plug 136 that may have at least one surface finish 134 and/or 132 on a die side of the mounting substrate foundation 2.

FIG. 3a is a detail section of the microelectronic device apparatus 303 depicted in FIG. 3d during processing according to an example embodiment. The apparatus 300 is depicted as a mounting substrate foundation 3 being mated to a microelectronic die 366. The mounting substrate foundation 3 shows a portion of a structure including an electrically conductive first plug 336, a dielectric first layer 315, a surface finish first film 332 and a surface finish second film, 334. An electrical contact 382 such as a microball 382 is also disposed on the surface finish first film 332.

The exhibited portion of the microelectronic die 366 also has a die bump 368 such as a solder paste for reflow. After mating the microelectronic die 366 to the mounting substrate foundation 3, the achieved structure may be see in FIG. 3d.

FIG. 3b is a detail section of the microelectronic device apparatus 303 depicted in FIG. 3d during processing according to an example embodiment. The apparatus 301 is depicted as a mounting substrate foundation 3 being mated to a microelectronic die 366. The mounting substrate foundation 3 shows a portion of a structure including an electrically conductive first plug 336, a dielectric first layer 315, a surface finish first film 332 and a surface finish second film, 334. An electrical contact 382 such as a solder interconnect 382 is also disposed on the surface finish first layer 332.

The exhibited portion of the microelectronic die 366 also has a die bond pad 367 but no die bump is prepared in this embodiment. After mating the microelectronic die 366 to the mounting substrate foundation 3, the achieved structure may be see in FIG. 3d.

FIG. 3c is a detail section of the microelectronic device apparatus 303 depicted in FIG. 3d during processing according to an example embodiment. The apparatus 302 is depicted as a mounting substrate foundation 3 being mated to a microelectronic die 366. The mounting substrate foundation 3 shows a portion of a structure including an electrically conductive first plug 336, a dielectric first layer 315, a surface finish first film 332 and a surface finish second film, 334. No electrical contact is prepared on the surface finish first film 332 before mating according to an embodiment.

The exhibited portion of the microelectronic die 366 also has a die bump 368 such as a solder paste for reflow. After mating the microelectronic die 366 to the mounting substrate foundation 3, the achieved structure may be seen in FIG. 3d.

FIG. 3d is a cross section elevation of a microelectronic device apparatus 303 according to an example embodiment. The mounting substrate foundation 3 is flip-chip mated to a microelectronic die 366. Several electrical contacts electrically couple the microelectronic die 366 to the mounting substrate foundation 3. Two electrical contacts are delineated. A perimeter electrical contact 370 and a center electrical contact 378 are depicted. The perimeter electrical contact 370 is next to the edge 324 of the mounting substrate foundation 3. In an embodiment, the perimeter electrical contact 370 is larger than the center electrical contact 378. In an embodiment, the perimeter electrical contact 370 is substantially the same size as the center electrical contact 378.

The pitch 330 between any to electrical contacts may be any pitch embodiment set forth in this disclosure. Further, a standoff 380 exists between the microelectronic die 366 and the mounting substrate foundation 3. In an embodiment, the standoff 380 is about 60 µm. In an embodiment, the standoff 380 is about 60 µm, the pitch 330 between any two electrical contacts is about 150 µm, and the electrical contacts are formed by mating a solder interconnect on the mounting substrate foundation 3 to a solder bump on the microelectronic die 366. In an embodiment, the standoff 380 is about 60 µm, the pitch 330 between any two electrical contacts is about 150 µm, and the electrical contacts are formed by mating a solder interconnect on the mounting substrate foundation 3 to a bond pad on the microelectronic die 366. In an embodiment, the standoff 380 is about 60 µm, the pitch 330 between any two electrical contacts is about 150 µm, and the electrical contacts are formed by mating a the mounting substrate foundation 3 to a solder bump on the microelectronic die 366.

In an embodiment, the apparatus 303 includes a board 376 such as a motherboard. The mounting substrate foundation 3 is bumped to the board 376 through a series of board bumps, one of which is designated with reference numeral 376. In an embodiment, a pitch 372 between two board bumps 374 is about 400 µm and the board bumps 374 have a diameter of about 200 µm. It can now be seen the mounting substrate foundation 3 has a die side and a land or board side. The perimeter electrical contact 370 and the center electrical contact 372 are on the die side and the board bump 374 is on the land side.

Figure 4:
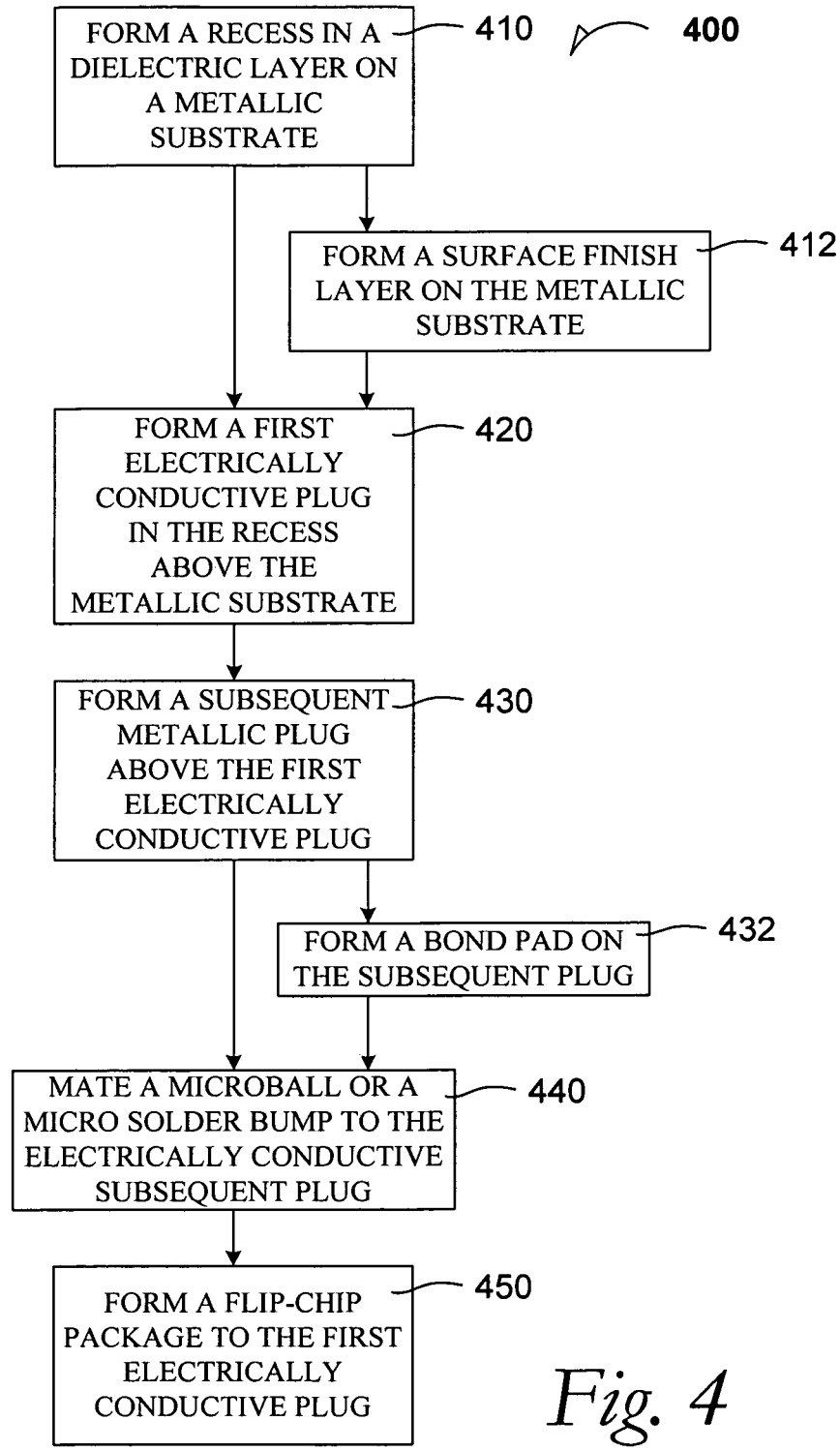
FIG. 4 is a process flow diagram according to an embodiment.

FIG. 4 is a process flow diagram 400 according to an embodiment.

At 410, the process includes forming a recess in a dielectric layer on a metallic substrate.

At 412, the process includes forming a surface finish on the metallic substrate. In an embodiment, forming the surface finish includes forming a first surface finish layer and a second surface finish layer.

At 420, the process includes forming a first electrically conductive plug in the recess above the metallic substrate. In an embodiment, forming the first electrically conductive plug is done in direct contact to the metallic substrate. In an embodiment, forming the first electrically conductive plug is done in direct contact to a surface finish layer that is above the metallic substrate additional routing is added for the layer according to the specific application (not shown).

At 430, the process includes forming a subsequent metallic plug above the first electrically conductive plug and its respective routing for the layer according to the specific application (not shown).

At 432, the process includes forming a bond pad on the subsequent plug.

At 440, the process includes mating a micro ball or a micro solder bump to the subsequent electrically conductive plug.

At 450, the process includes forming a flip-chip package between the laminate that contains the subsequent electrically conductive plug and a microelectronic die.

Figure 5:
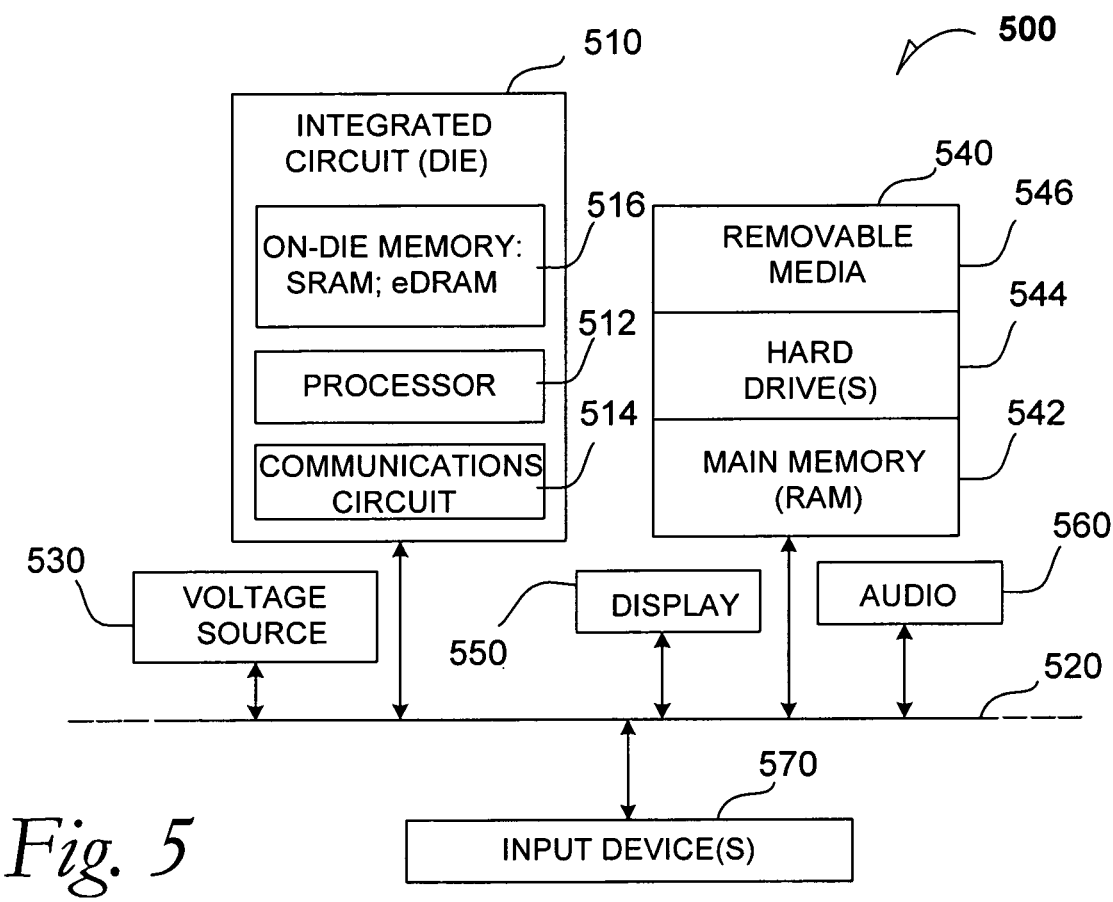
FIG. 5 is a schematic of an electronic system according to an embodiment.

FIG. 5 is a schematic of an electronic system 500 according to an embodiment. The electronic system 500 as depicted can embody a mounting substrate or an apparatus with a tight-pitch laminate such as a pitch of 150 µm between subsequent electrically conductive plugs that each fill into a 74 µm diameter recess as set forth in this disclosure. In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. Other types of circuits that can be included in the integrated circuit 510 are a custom circuit or an ASIC, such as a communications circuit 514 for use in wireless devices such as cellular telephones, pagers, portable computers, two-way radios, and similar electronic systems. In an embodiment, the processor 510 includes on-die memory 516 such as SRAM. In an embodiment, the processor 510 includes on-die memory 516 such as eDRAM.

In an embodiment, the electronic system 500 also includes an external memory 840 that in turn may include one or more memory elements suitable to the particular application, such as a main memory 542 in the form of RAM, one or more hard drives 544, and/or one or more drives that handle removable media 546, such as diskettes, compact disks (CDs), digital video disks (DVDs), flash memory keys, and other removable media known in the art.

In an embodiment, the electronic system 500 also includes a display device 550, an audio output 560. In an embodiment, the electronic system 500 includes a controller 570, such as a keyboard, mouse, trackball, game controller, microphone, voice-recognition device, or any other device that inputs information into the electronic system 500.

As shown herein, the integrated circuit 510 can be implemented in a number of different embodiments, including an electronic package with a mounting substrate or an apparatus with a tight-pitch laminate such as a pitch of 150 µm between subsequent electrically conductive plugs that each fill into a 74 µm diameter recess, an electronic system, a computer system, one or more methods of fabricating an integrated circuit, and one or more methods of fabricating an electronic assembly that includes a mounting substrate or an apparatus with a tight-pitch laminate such as a pitch of 150 µm between subsequent electrically conductive plugs that each fill into a 74 µm diameter recess as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
   providing a mounting substrate, wherein the mounting substrate includes a central core, a center metallic substrate layer embedded in the central core, and a metallic substrate layer adjacent the center metallic substrate layer;
   forming a first dielectric layer on the metallic substrate layer, wherein the first dielectric layer has a die side adjacent the metallic substrate layer and an opposing land side;
   forming a recess through the first dielectric layer to expose a fraction of the metallic substrate layer;
   forming a surface finish first layer on the fraction of the metallic substrate layer that is exposed through the recess;
   forming an electrically conductive first plug within the recess;
   separating the center metallic substrate layer and central core from the metallic substrate layer;
   removing the metallic substrate layer, wherein removing the metallic substrate layer exposes the surface finish first layer and wherein the exposed surface finish first layer is planar to the first dielectric layer die side; and forming an electrical connector electrically coupled to the electrically conductive first plug proximate the first dielectric layer die side, after removing the metallic substrate layer.

2. The process of claim 1, further including:
forming a surface finish second layer on the surface finish first layer;
and
wherein forming the electrical connector electrically coupled to the conductive first plug includes forming the electrical connector on the surface finish first layer.

3. The process of claim 1, wherein forming the recess is carried out by radiant energy ablation to form a characteristic recess dimension.

4. The process of claim 1, wherein the metallic substrate layer is a first side metallic substrate layer disposed proximate a first side of the central core, and further including a second center metallic substrate layer adjacent a second side of the central core, and a second side metallic substrate layer disposed adjacent the second center metallic substrate layer embedded in the central core, the process further including:
forming a second side first dielectric layer on the second side metallic substrate layer, wherein the second side first dielectric layer includes a die side adjacent the second side metallic substrate layer and an opposing land side;
forming a second recess through the second dielectric layer to expose a fraction of the second side metallic substrate layer;
forming a surface finish first film on the fraction of the metallic substrate layer that is exposed through the second recess, wherein the surface first film is planar to the second dielectric layer die side;
forming an electrically conductive plug within the second recess; and
separating the center metallic substrate layer, the second center metallic substrate layer, and the central core from the first side metallic substrate layer and the second side metallic substrate layer.

5. The process of claim 1, wherein forming the recess is carried out by radiant energy ablation to form a characteristic recess dimension, the process further including:
forming a surface finish second film on the surface finish first film;
wherein forming the electrical connector electrically coupled to the conductive first plug includes forming the electrical connector on the surface finish first film.

6. The process of claim 1, further including mating a microelectronic die to the electrical connector.

7. The process of claim 1, further including:
forming an electrically conductive subsequent plug disposed proximate the first dielectric layer land side, wherein the electrically conductive subsequent plug is electrically coupled to the electrically conductive first plug, and disposed directly above the electrically conductive first plug; and
mating a microelectronic die to the electrical connector.

8. A process comprising:
providing a mounting substrate, wherein the mounting substrate includes a central core, a center metallic substrate layer embedded in the central core, and a metallic substrate layer adjacent the center metallic substrate layer;
forming a first dielectric layer on the metallic substrate layer, wherein the first dielectric layer has a die side adjacent the metallic substrate layer and an opposing land side;
forming a recess through the first dielectric layer to expose a fraction of the metallic substrate layer;
forming at least one surface finish layer in the recess and upon the metallic substrate layer, wherein the at least one surface finish layer is planar to the first dielectric layer die side;
forming an electrically conductive first plug within the recess in contact with the at least one surface finish layer;
forming an electrically conductive subsequent plug disposed proximate the first dielectric layer land side, wherein the electrically conductive subsequent plug is electrically coupled to the electrically conductive first plug, and disposed directly above the electrically conductive first plug;
separating the center metallic substrate layer and central core from the metallic substrate layer;
removing the metallic substrate layer; and
forming an electrical connector in contact with the at least one surface finish layer, after removing the metallic substrate layer.

9. The process of claim 8, wherein forming the recess is accomplished by laser ablation to achieve a characteristic dimension, and wherein forming the electrical connector is carried out within the characteristic dimension.

10. The process of claim 8, further including:
electrically coupling the electrically conductive subsequent plug through the electrically conductive first plug; and
mating a microelectronic die to the electrically conductive first plug through the at least one surface finish film, and wherein mating includes mating the electrical connector disposed on the at least one surface finish layer to an electrical connector solder bump on the microelectronic die.

11. The process of claim 8, further including:
electrically coupling the electrically conductive subsequent plug through the electrically conductive first plug; and
mating a microelectronic die to the electrically conductive first plug through the at least one surface finish film, and wherein mating includes mating the electrical connector disposed on the microelectronic die to the at least one surface finish film.

12. The process of claim 8, further including:
electrically coupling the electrically conductive subsequent plug through the electrically conductive first plug; and
mating a microelectronic die to the electrically conductive first plug through the at least one surface finish film, and wherein mating includes mating the electrical connector disposed on the at least one surface finish layer to a bond pad on the microelectronic die.

13. A process comprising:
providing a mounting substrate, wherein the mounting substrate includes a central core, a center metallic substrate layer embedded in the central core, and a metallic substrate layer adjacent the center metallic substrate layer;
forming a first dielectric layer on the metallic substrate layer, wherein the first dielectric layer has a die side adjacent the metallic substrate layer and an opposing land side;
forming a recess through the first dielectric layer to expose a fraction of the metallic substrate layer;
forming an in situ surface finish first layer on the fraction of the metallic substrate layer that is exposed through the recess, wherein the surface finish first layer is planar to the first dielectric layer die side;

forming an in situ surface finish second layer on the surface finish first layer;

forming an electrically conductive first plug within the recess in contact with the surface finish second layer and coupled to the metallic substrate layer;

forming an electrically conductive second plug in contact with the electrically conductive first plug;

forming an electrically conductive subsequent plug that is coupled to the electrically conductive second plug;

separating the center metallic substrate layer and central core from the metallic substrate layer;

removing the metallic substrate layer; and forming an electrical connector electrically in contact with the surface finish first layer and coupled to the electrically conductive first plug proximate the first dielectric layer die side, after removing the metallic substrate layer.

14. The process of claim 13, wherein forming the recess is carried out by radiant energy ablation to form a characteristic recess dimension.

15. The process of claim 13, wherein the metallic substrate layer is a first side metallic substrate layer disposed proximate a first side of the central core, and further including a second center metallic substrate layer embedded in a second side of the central core, and a second side metallic substrate layer disposed adjacent the second center substrate layer, the process further including:

forming a second side first dielectric layer on the second side metallic substrate layer, wherein the second side first dielectric layer includes a die side adjacent the second side metallic substrate layer and an opposing land side;

forming a second recess through the second dielectric layer to expose a fraction of the second side metallic substrate layer;

forming a surface finish first layer on the fraction of the metallic substrate layer that is exposed through the second recess, wherein the surface first layer is planar to the second dielectric layer die side;

forming an electrically conductive first plug within the second recess;

forming an electrically conductive second plug in contact with the electrically conductive first plug coupled to the second side metallic substrate;

forming an electrically conductive subsequent plug that is coupled to the electrically conductive second plug; and separating the center metallic substrate layer, the second center metallic substrate layer, and the central core from the first side metallic substrate layer and the second side metallic substrate layer.

16. The process of claim 13, further including mating a microelectronic die to the electrical connector.

17. A process comprising:

providing a mounting substrate, wherein the mounting substrate includes a central core, a center metallic substrate layer embedded in the central core, and a metallic substrate layer adjacent the center metallic substrate layer;

forming a first dielectric layer on the metallic substrate layer, wherein the first dielectric layer has a die side adjacent the metallic substrate layer and an opposing land side;

forming a recess through the first dielectric layer to expose a fraction of the metallic substrate layer by laser ablation to achieve a characteristic dimension;

forming at least one surface finish layer in the recess and upon the metallic substrate layer, wherein the at least one surface finish first layer is planar to the first dielectric layer die side;

forming an electrically conductive first plug within the recess in contact with the at least one surface finish layer;

forming an electrically conductive second plug disposed on the land side and in contact with the electrically conductive first plug;

forming an electrically conductive subsequent plug disposed on the land side, wherein the electrically conductive subsequent plug is electrically coupled to the electrically conductive second plug, and disposed directly above the electrically conductive second plug;

separating the center metallic substrate layer and central core from the metallic substrate layer;

removing the metallic substrate layer; and forming an electrical connector in contact with the at least one surface finish layer, wherein forming the electrical connector is carried out within the characteristic dimension, after removing the metallic substrate layer.

18. The process of claim 17, further including:

mating a microelectronic die to the electrically conductive first plug through the at least one surface finish film, and wherein mating includes mating the electrical connector disposed on the microelectronic die to the at least one surface finish film.

19. The process of claim 17, further including:

electrically coupling the electrically conductive subsequent plug through the electrically conductive first plug; and mating a microelectronic die to the electrically conductive first plug through the at least one surface finish film, and wherein mating includes mating the electrical connector disposed on the at least one surface finish layer to a bond pad on the microelectronic die.

* * * * *